United States Patent
Pan et al.

(10) Patent No.: US 8,361,900 B2
(45) Date of Patent: Jan. 29, 2013

(54) BARRIER LAYER FOR COPPER INTERCONNECT

(75) Inventors: Shing-Chyang Pan, Jhudong Township (TW); Han-Hsin Kuo, Tainan (TW); Chung-Chi Ko, Nantou (TW); Ching-Hua Hsieh, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 41 days.

(21) Appl. No.: 12/761,805

(22) Filed: Apr. 16, 2010

(65) Prior Publication Data

US 2011/0256715 A1    Oct. 20, 2011

(51) Int. Cl.
*H01L 21/44* (2006.01)
(52) U.S. Cl. ......................................... 438/660
(58) Field of Classification Search .................. 438/639, 438/652, 660
See application file for complete search history.

(56) References Cited

U.S. PATENT DOCUMENTS

| | | | |
|---|---|---|---|
| 5,904,565 A | 5/1999 | Nguyen et al. | |
| 5,969,422 A | 10/1999 | Ting et al. | |
| 6,836,017 B2 | 12/2004 | Ngo et al. | |
| 7,026,238 B2 | 4/2006 | Xi et al. | |
| 7,485,915 B2 | 2/2009 | Nasu et al. | |
| 7,727,888 B2 | 6/2010 | Yang et al. | |
| 8,072,075 B2 * | 12/2011 | Jourdan et al. | 257/767 |
| 2007/0049024 A1 | 3/2007 | Nakao et al. | |
| 2007/0148944 A1 | 6/2007 | Lee | |
| 2008/0054467 A1 | 3/2008 | Ohba et al. | |
| 2008/0142974 A1 | 6/2008 | Arakawa | |
| 2008/0173547 A1 | 7/2008 | Ohba et al. | |
| 2008/0179747 A1 | 7/2008 | Sakai et al. | |
| 2008/0213998 A1 * | 9/2008 | Nagai et al. | 438/653 |
| 2008/0230375 A1 | 9/2008 | Maekawa et al. | |
| 2009/0206485 A1 | 8/2009 | Yang et al. | |
| 2010/0320604 A1 * | 12/2010 | Isobayashi | 257/751 |
| 2011/0006429 A1 * | 1/2011 | Liu et al. | 257/751 |
| 2011/0049718 A1 | 3/2011 | Matsumoto et al. | |
| 2011/0100697 A1 | 5/2011 | Yang et al. | |
| 2011/0233780 A1 * | 9/2011 | Gordon et al. | 257/751 |

FOREIGN PATENT DOCUMENTS

| | | |
|---|---|---|
| CN | 101515562 | 8/2009 |
| CN | 101687896 | 3/2010 |

OTHER PUBLICATIONS

Kudo, H. et al., "Further Enhancement of Electro-Migration Resistance by Combination of Self-Aligned Barrier and Copper Wiring Encapsulation Techniques for 32-nm Nodes and Beyond", IEEE 2008, pp. 117-119.
Kudo, H. et al., "Copper Wiring Encapsulation with Ultra-Thin Barriers to Enhance Wiring and Dielectric Reliabilities for 32-nm Nodes and Beyond", IEEE 2007, pp. 513-516.
Usui, T., et al., "High Performance Ultra Low-k (k=2.0keff-2.4)/Cu Dual-Damascene Interconnect Technology with Self-Formed MnSixOy Barrier for 32 nm-node", IEEE 2006, pp. 216-218.
Iijima, J., et al, "Growth Behavior of Self-Formed Barrier Using Cu-Mn Alloys at 350 to 600 C", IEEE 2006, pp. 155-157. Ohoka, Y., et al., "Integration of High Performance and Low Cost Cu/Ultra Low-k SiOC (k=2.0) Interconnection with Self-Formed Barrier Technology for 32nm-node and Beyond", IEEE 2007, pp. 67-69.
Office Action dated Nov. 5, 2012 from corresponding application No. CN 201010198417.5.

* cited by examiner

*Primary Examiner* — Jenny L Wagner
(74) *Attorney, Agent, or Firm* — Lowe Hauptman Ham & Berner, LLP

(57) ABSTRACT

A copper interconnect includes a copper layer formed in a dielectric layer. A liner is formed between the copper layer and the dielectric layer. A barrier layer is formed at the boundary between the liner and the dielectric layer. The barrier layer is a metal oxide.

23 Claims, 11 Drawing Sheets

BARRIER LAYER FOR COPPER INTERCONNECT

RELATED APPLICATIONS

The present disclosure is related to the following commonly-assigned U.S. patent applications, the entire disclosures of which are incorporated herein by reference: U.S. application Ser. No. 12/832,790 for "Barrier Layers for Copper Interconnect".

TECHNICAL FIELD

The present disclosure relates to semiconductor devices, and particularly to copper interconnects and methods for their fabrication.

BACKGROUND

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines, and the spacing between the conductive lines of back-end of line (BEOL) interconnect structures also need to scale smaller.

A move is being made away from the traditional materials used in the past in semiconductor device designs, in order to meet these demands. To reduce the RC time delay, low dielectric constant (low-k) materials are being used as insulating materials, and there is a switch being made to the use of copper for interconnect materials, rather than aluminum. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay, for example.

Copper interconnects are often formed using damascene processes rather than by direct etching. Damascene processes are typically either single or dual damascene, which includes forming openings by patterning and etching inter-metal dielectric (IMD) layers and filling the openings with copper. Because copper diffuses easily into some dielectric materials, especially some types of low-k dielectric materials, a diffusion barrier layer is usually deposited on the inner walls of the damascene opening before the copper is formed. Refractory metals such as tantalum (Ta) or titanium (Ti), or nitride compounds of these metals are used as materials of the diffusion barrier layer. However, there are some challenges in using refractory metals in the copper damascene structure since these metallic films have high resistance, thereby causing increased resistance in the copper lines and increased RC delay, especially in small, narrow features.

As the shrinkage of copper lines has progressed in recent years, there is a trend towards thinner films being used for the diffusion barrier layer. Physical vapor deposition (PVD) process used for depositing a thinner TaN/Ta barrier layer encounters difficulties in advanced scale of interconnection. Atomic layer deposition (ALD) process is the candidate to deposit a very thin diffusion barrier layer with uniform coverage, but the ALD method is disadvantageous because of extremely low deposition rate and poor throughput. In addition, in manufacturing the TaN/Ta film, a problem occurs in which favorable adhesion between diffusion barrier layer and the IMD layer cannot be achieved. For example, copper lines peel off at the interface, worsening the yield of the semiconductor device.

Therefore, there is a need for an improved diffusion barrier layer in the copper interconnect, and a method of forming thereof.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion

DETAILED DESCRIPTION

Figure 1A:
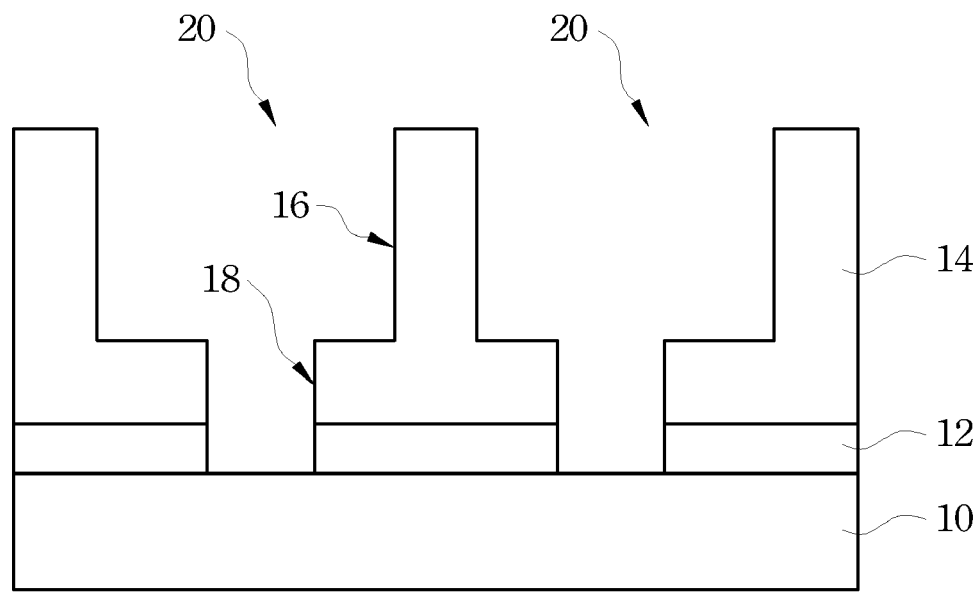
FIG. 1A-1F are cross-sectional diagrams illustrating various process steps of forming a copper interconnect in accordance with an embodiment of the present disclosure.

Various embodiments provide a barrier layer formed in a copper interconnect structure of a semiconductor device and methods of forming thereof, which has wide applicability to many manufacturers, factories and industries, including integrated circuit fabrications, microelectronic fabrications, and optical electronic fabrications. Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present.

FIGS. 1A-1F illustrate a first method of forming a copper interconnect in accordance with an embodiment of the present disclosure. With reference now to FIG. 1A, a semiconductor substrate 10 is provided with a stacked dielectric structure including a first etch stop layer 12 and an inter-metal dielectric (IMD) layer 14 formed thereon, and openings 20 formed in the stacked dielectric structure. The semiconductor substrate 10 is a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. A conductive region formed in and/or on the semiconductor substrate 10 is a portion of conductive routes and has exposed surfaces that may be treated by a planarization process, such as chemical mechanical polishing. Suitable materials for the conductive regions may include, but not limited to, for example copper, aluminum, copper alloy, or other mobile conductive materials. Copper interconnect level may be the first or any subsequent metal interconnect level of the semiconductor device.

The first etch stop layer 12 for controlling the end point during subsequent etching processes is deposited on the semiconductor substrate 10. The first etch stop layer 12 may be formed of silicon oxide, silicon nitride, silicon carbide, silicon oxynitride or combinations thereof, with a thickness of about 10 angstroms to about 1000 angstroms, which may be formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The IMD layer 14 may be a single layer or a multi-layered structure. The thickness of the IMD layer 14 varies with the applied technology, for example a thickness of about 1000 angstroms to about 30000 angstroms. The IMD layer 14 may be formed of $SiO_2$, carbon-doped $SiO_2$, a comparatively low dielectric constant (k value) dielectric material with a k value less than about 4.0, or combinations thereof. The IMD layer 14 may be formed of a low-k dielectric material, an extreme low-k dielectric material, a porous low-k dielectric layer, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with various embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. The IMD layer 14 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

In various embodiments, the IMD layer 14 is a nitrogen-containing layer, a carbon-containing layer, or a carbon-containing and nitrogen-containing layer for increasing corrosion resistance during a subsequent chemical mechanical polishing (CMP) process and/or increasing electromigration resistance. In one embodiment, the IMD layer 14 is a silicon-containing and nitrogen-containing dielectric layer. In another embodiment, the IMD layer 14 is a silicon-containing and carbon-containing dielectric layer. In other embodiments, the IMD layer 14 is a silicon-containing, nitrogen-containing, and carbon-containing dielectric layer. In one embodiment, the IMD layer 14 has a ratio by weight of carbon to silicon about equal or greater than 0.5. In another embodiment, the IMD layer 14 has a ratio by weight of nitrogen to silicon about equal or greater than 0.3. In another embodiment, the IMD layer 14 has a ratio by weight of carbon to silicon about equal or greater than 0.5 and a ratio by weight of nitrogen to silicon about equal or greater than 0.3.

The opening 20 is an exemplary dual damascene opening 20 including an upper trench section 16 and a lower via-hole section 18 patterned in the MLD layer 14 to define a contact region on the semiconductor substrate 10. Although the embodiments illustrate dual damascene openings in the IMD layer, the use of single damascene openings in the IMD layer also provide values. In dual damascene techniques including a "via-first" patterning method or a "trench-first" patterning method, the upper trench section 16 and the lower via-hole section 18 may be formed using a typical lithographic with masking technologies and anisotropic etch operation (e.g. plasma etching or reactive ion etching). A bottom etch stop layer, a middle etch stop layer, a polish stop layer, or an anti-reflective coating (ARC) layer may be optionally deposited on or intermediately in the IMD layer 14, providing a clear indicator of when to end a particular etching process.

Figure 1B:
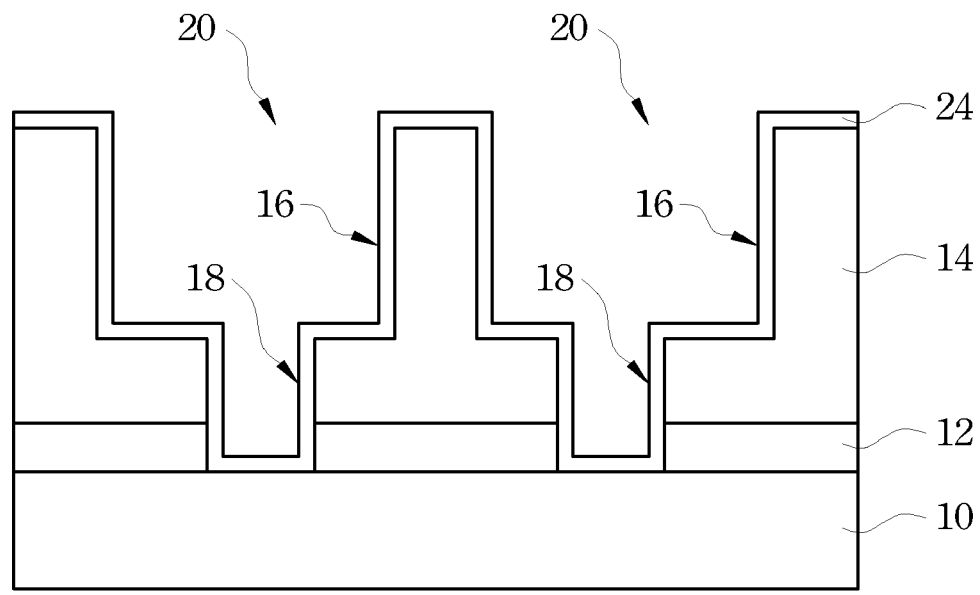

Referring to FIG. 1B, a conductive seed layer 24 is formed on the above-described structure to line the sidewalls and bottoms of the dual damascene openings 20. The conductive seed layer 24 has a thickness of about 100 angstroms to about 1000 angstroms, and preferably ranging from about 500 angstroms to about 700 angstroms. In one embodiment, the conductive seed layer 24 is a metal alloy layer containing at least a main metal element, e.g., copper (Cu), and a first additive metal element, e.g., manganese (Mn), Aluminum (Al). In another embodiment, the conductive seed layer 24 is a copper-manganese (CuMn) layer. The ratio of manganese to copper contained in the CuMn layer is not limited. In other embodiments, Ti, Al, Nb, Cr, V, Y, Tc, Re, or the like can be utilized as an another additive metal for forming the conductive seed layer 24. The conductive seed layer 24 may be deposited by using physical vapor deposition (PVD), chemical vapor deposition (CVD), plasma enhanced CVD (PECVD), low pressure CVD (LPCVD), or other well-known deposition techniques.

Figure 1C:
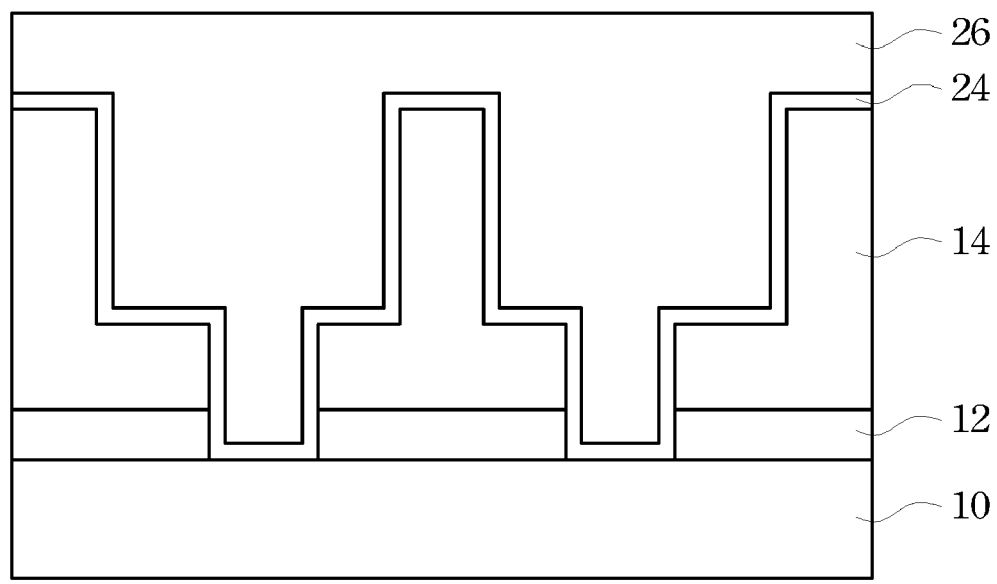

Next, in FIG. 1C, for filling the dual damascene openings 20, a deposition process, for example electro-chemical plating (ECP), is carried out to form a conductive layer 26 on the conductive seed layer 24 and fill the trench section 16 and the via-hole section 18. The conductive layer 26 at least contains the main metal element, e.g., copper (Cu), as contained in the conductive seed layer 24. The conductive layer 26 may further contains a second additive metal element different from the first additive metal element, such as tantalum, indium, tin, zinc, manganese, chromium, titanium, germanium, strontium, platinum, magnesium, aluminum or zirconium.

Figure 1D:
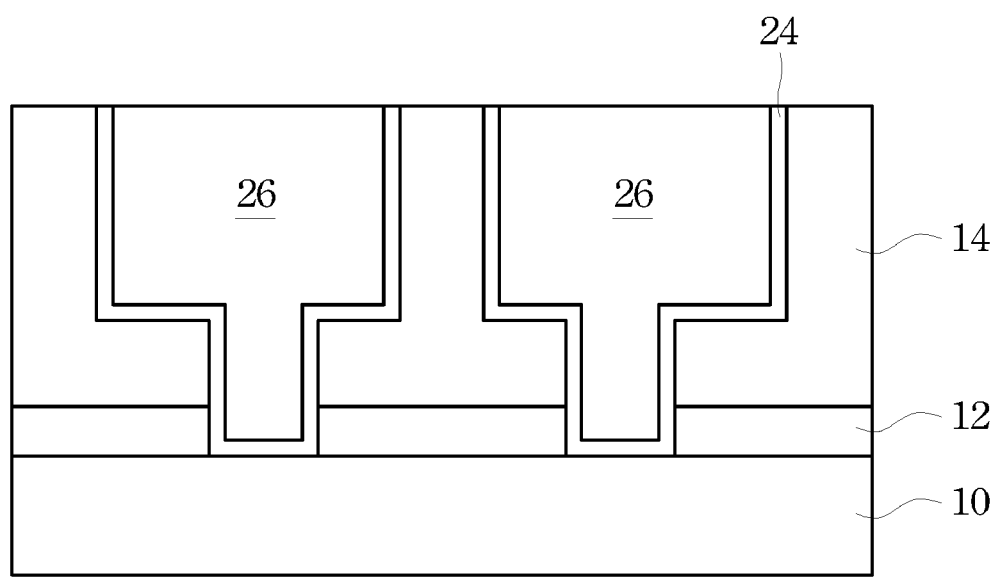

In FIG. 1D, a chemical mechanical polishing (CMP) process is performed after the formation of the conductive layer 26 to remove the excess portions of the conductive layer 26 and the conductive seed layer 24 outside the dual damascene openings 20, thus exposing the top surface of the IMD layer 14 and achieving a planarized surface.

Figure 1E:
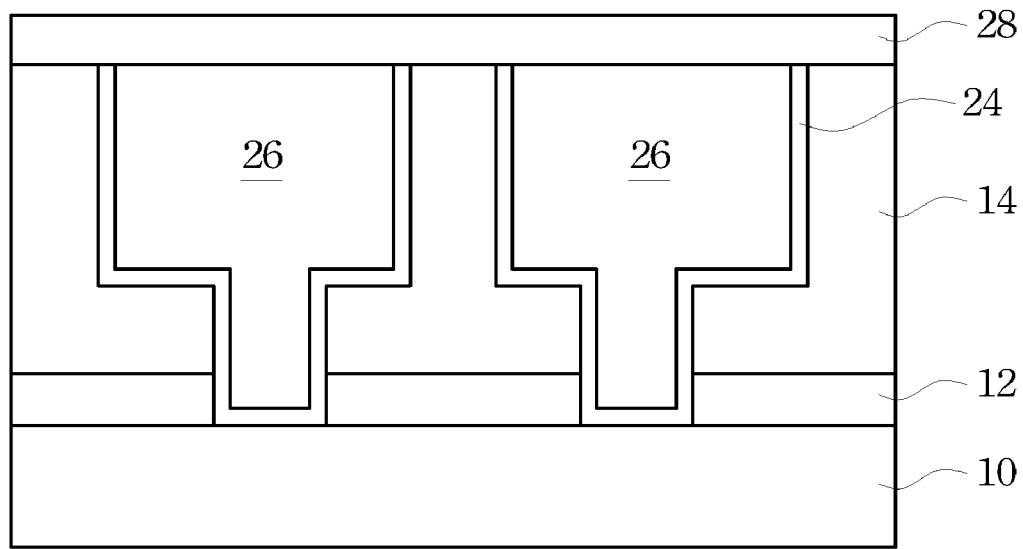

Referring to FIG. 1E, a second etch stop layer 28 is formed on the above-described planarized surface. The second etch stop layer 28 may control the end point during subsequent etching processes. The second etch stop layer 28 may be formed of silicon oxide, silicon nitride, silicon carbide, silicon oxynitride or combinations thereof, with a thickness of about 10 angstroms to about 1000 angstroms, which may be formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

In addition, after the formation of the conductive layer 26, a thermal treatment, for example an annealing process, is performed on the substrate 10. In one embodiment, the step of thermal treatment is provided at the time immediately after the formation of the conductive layer 26. In another embodiment, the step of thermal treatment is provided at the time immediately after the step of CMP of removing the excess portions of the conductive layer 26 outside the dual damascene openings 20. In another embodiment, the step of thermal treatment is provided at the time immediately after the step of forming the second etch stop layer 28. In another embodiment, the step of thermal treatment is provided at the time after the step of forming a passivation layer on a top metal layer. The temperature of the annealing process is preferably in the range of between about 137° C. and about 600° C., and is more preferably in the range of between about 280° C. and about 400° C. The duration of the annealing process may be in the range of between about 10 min. and about 600 min. by using furnace, rapid thermal processing (RTP), or hot plate equipment. During and/or after the annealing process, the first additive metal element of the conductive seed layer 24 may partially or completely diffuse to the surface of the IMD layer 14 and react with the IMD layer 14.

Figure 1F:
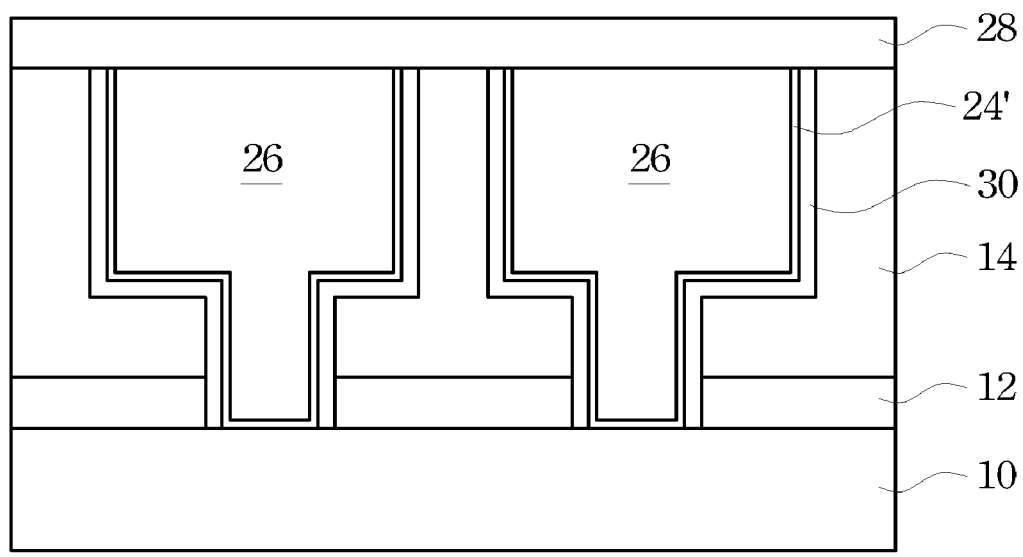

Referring to FIG. 1F, a barrier layer 30 is formed by the reaction of the IMD layer 14 with the diffused first additive metal element. The barrier layer 30 is formed in a self-aligned manner at the boundary between the IMD layer 14 and the conductive seed layer 24. The barrier layer 30 may have a thickness in the range of between about 5 angstrom and about 30 angstroms, and preferably ranging from about 10 angstroms to about 20 angstroms. The formation of the barrier layer 30 may consume some of the conductive seed layer 24 and the IMD layer 14. In one embodiment, the barrier layer 30 is a carbon-containing layer or a nitrogen-containing layer because the carbon or the nitrogen existed in the IMD layer 14 reacts with the first additive metal element during the annealing process. In another embodiment, the barrier layer 30 is MnOx and/or MnSiyOz with carbon and/or nitrogen. In another embodiment, the barrier layer 30 has a ratio by weight of carbon to silicon about equal or greater than 0.5 and/or nitrogen to silicon about equal or greater than 0.3. The barrier layer 30 may function as a protector to prevent the conductive layer 26 diffusing into the IMD layer 14.

After the annealing process, the conductive seed layer 24 is transformed to be a post conductive seed layer 24'. In one embodiment, the post conductive seed layer 24' contains the main metal element and the first additive metal element remained therein, wherein the content of the first additive metal element in the post conductive seed layer 24' is less than the content of the first additive metal element in the conductive seed layer 24. In another embodiment, the post conductive seed layer 24' contains the main metal element but without the first additive metal element because the first additive metal element has been consumed entirely after the annealing process.

Figure 2A:
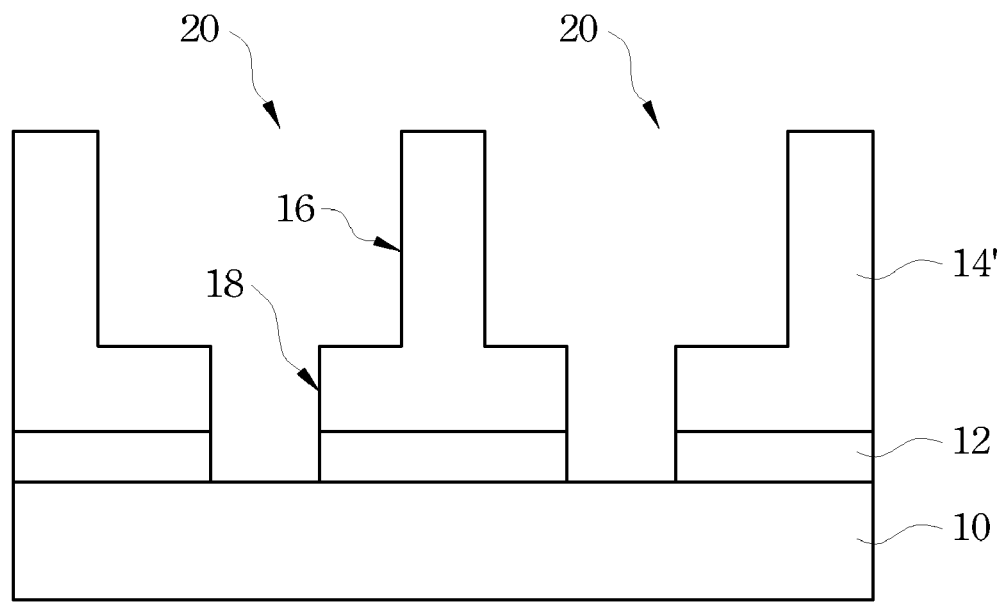
FIG. 2A-2H are cross-sectional diagrams illustrating various process steps of forming a copper interconnect in accordance with another embodiment of the present disclosure.

FIGS. 2A-2H illustrate a second method of forming a copper interconnect in accordance with an embodiment of the present disclosure. With reference now to FIG. 2A, a semiconductor substrate 10 is provided with a stacked dielectric structure including a first etch stop layer 12 and an inter-metal dielectric (IMD) layer 14' formed thereon, and openings 20 formed in the stacked dielectric structure. The IMD layer 14' may be formed of $SiO_2$, carbon-doped $SiO_2$, a comparatively low dielectric constant (k value) dielectric material with a k value less than about 4.0, or combinations thereof. The IMD layer 14' may be formed of a low-k dielectric material, an extreme low-k dielectric material, a porous low-k dielectric layer, and combinations thereof.

Figure 2B:
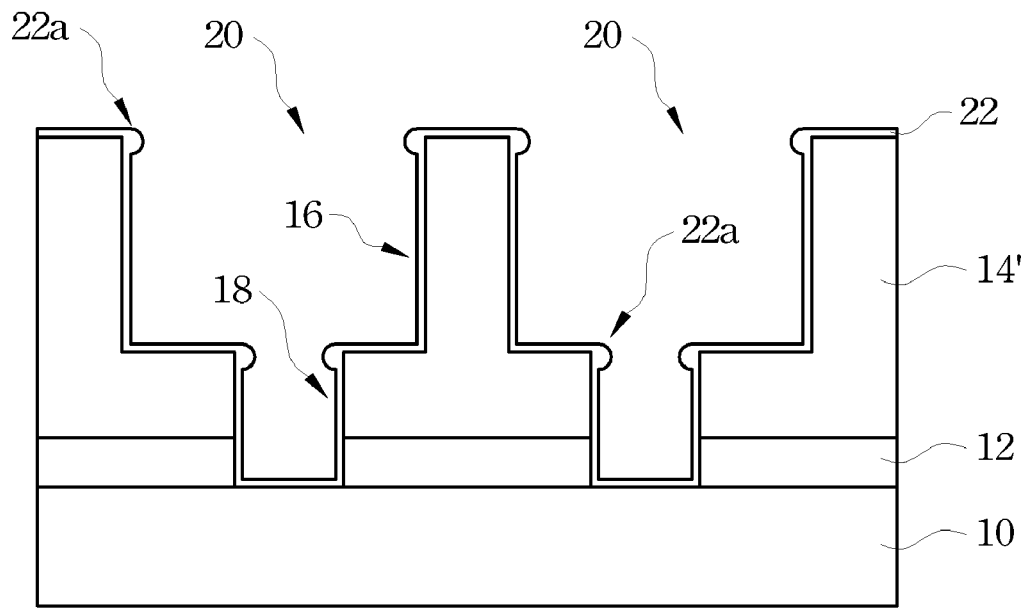

Referring now to FIG. 2B, a liner 22 is deposited on the above-described structure to line the sidewalls and bottoms of the dual damascene openings 20. The liner 22 has a thickness of about 10 angstroms to about 300 angstroms, and preferably in the range of between about 5 angstroms and about 50 angstroms. In various embodiments, the liner 22 is a carbon-containing dielectric layer and/or a nitrogen-containing dielectric layer. The liner 22, for example, is silicon carbide (SiC), silicon carbon nitride (SiCN), silicon oxycarbide (SiCO), silicon nitride (SiN), silicon oxycarbide nitride (SiCON), or the like, which may be formed by any suitable process including chemical vapor deposition (CVD), physical vapor deposition (PVD), atomic layer deposition (ALD), or plasma enhanced CVD (PECVD).

Figure 2C:
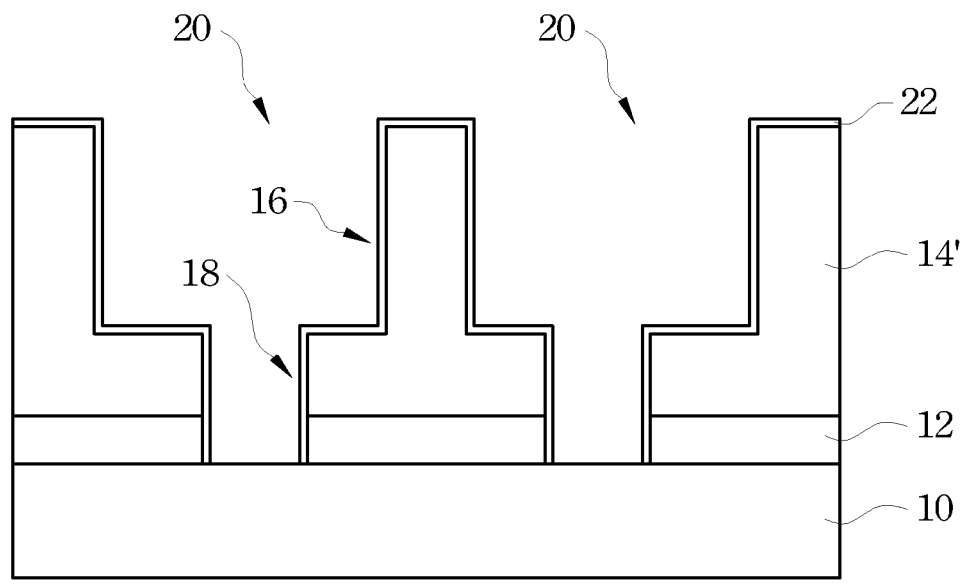
Figure 2D:
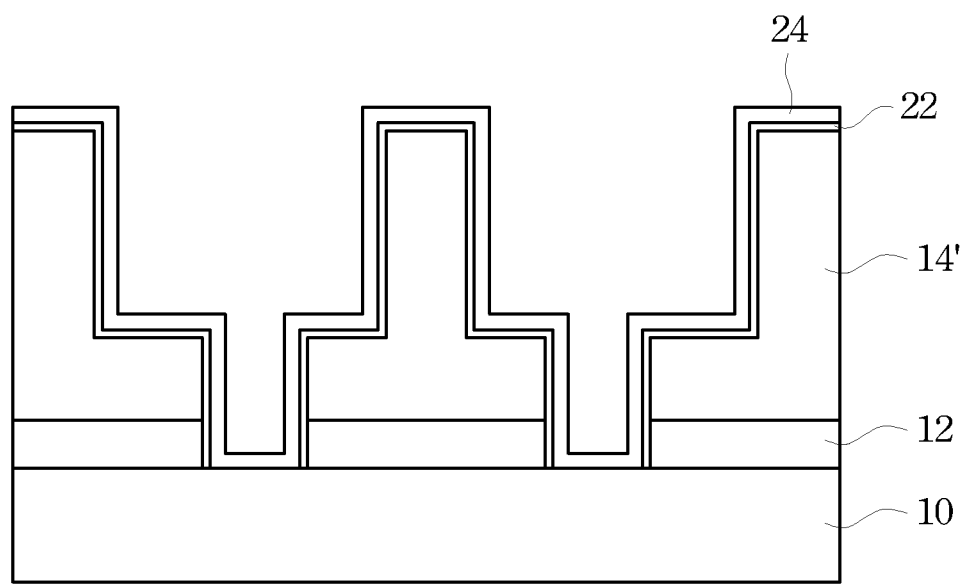

Referring to FIG. 2C, a process is provided on the above-described structure to remove overhangs 22a on shoulders of the trench section 16 and/or the via-hole section 18, and to remove the liner 22 on bottom of the dual damascene openings 20. The removing process is, for example, a plasma etching process. Referring to FIG. 2D, a conductive seed layer 24 is formed on the above-described structure to line the sidewalls of the liner 22 and bottom of the dual damascene openings 20.

Figure 2E:
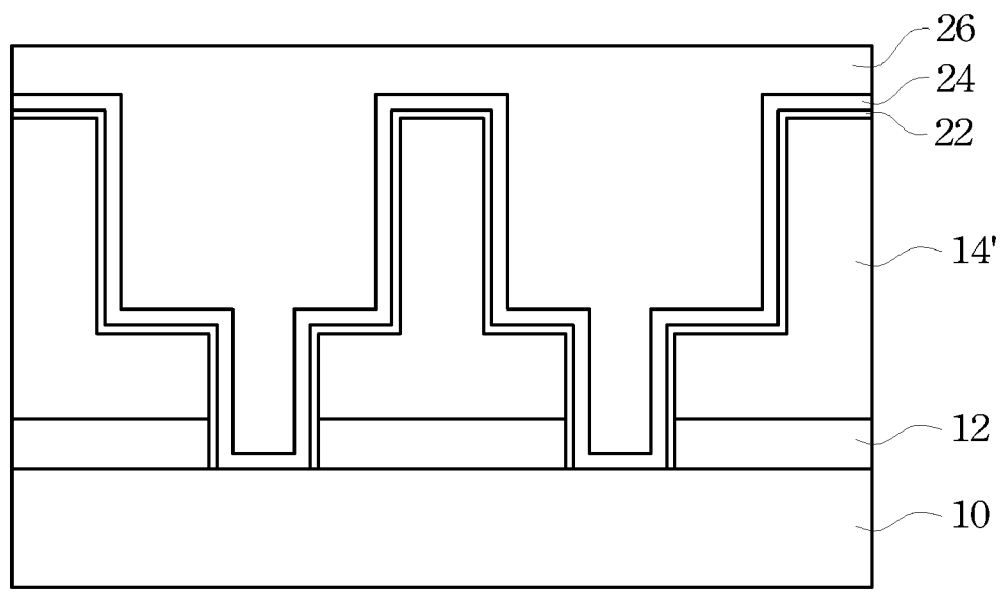
Figure 2F:
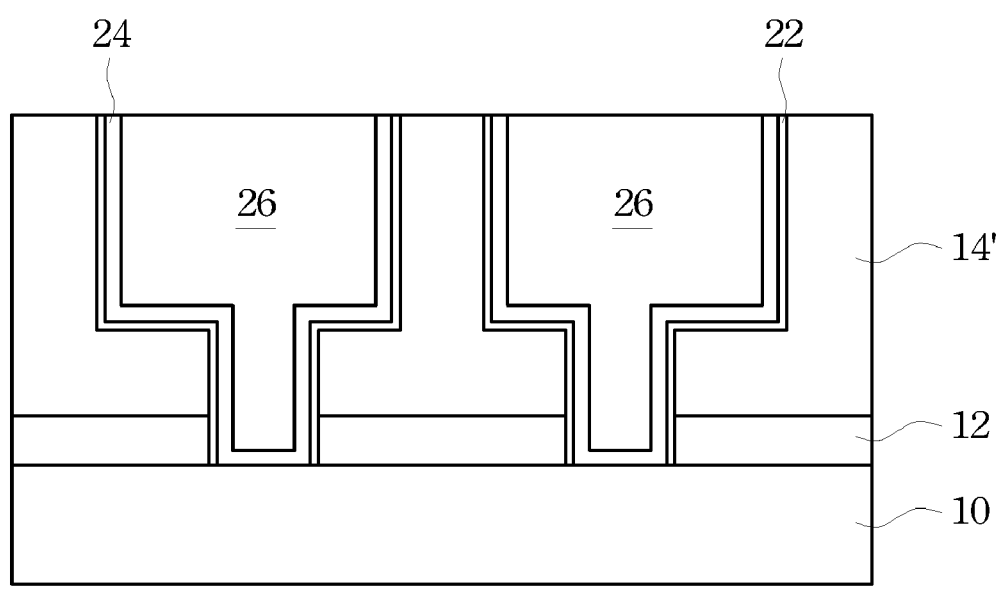

In FIG. 2E, a conductive layer 26 is filled in the dual damascene openings 20 with the process described above to FIG. 1C. Next referring to FIG. 2F, a CMP process is performed to remove the excess portions of the conductive layer 26, and the conductive seed layer 24 and the liner 22 outside the dual damascene openings 20, thus exposing the top surface of the IMD layer 14 and achieving a planarized surface.

Figure 2G:
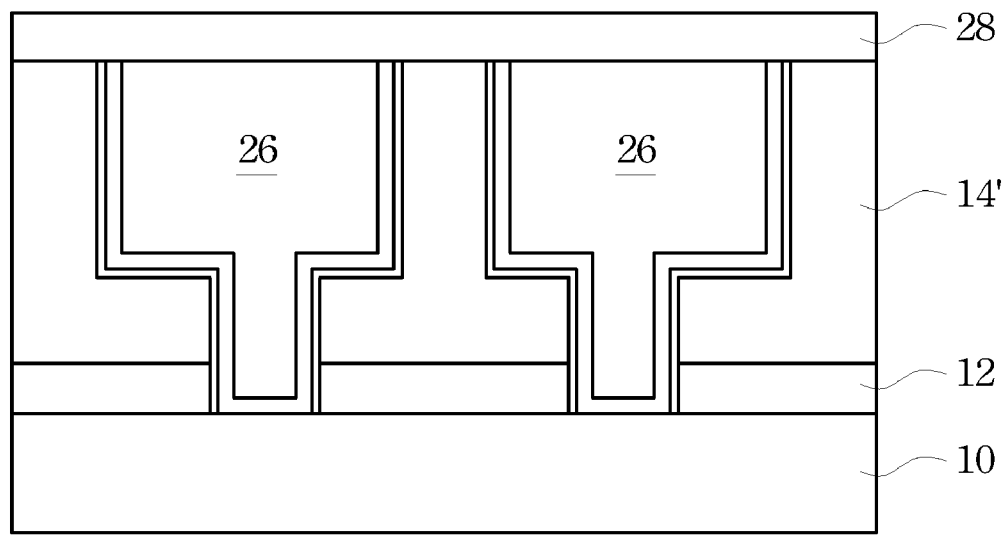
Figure 2H:
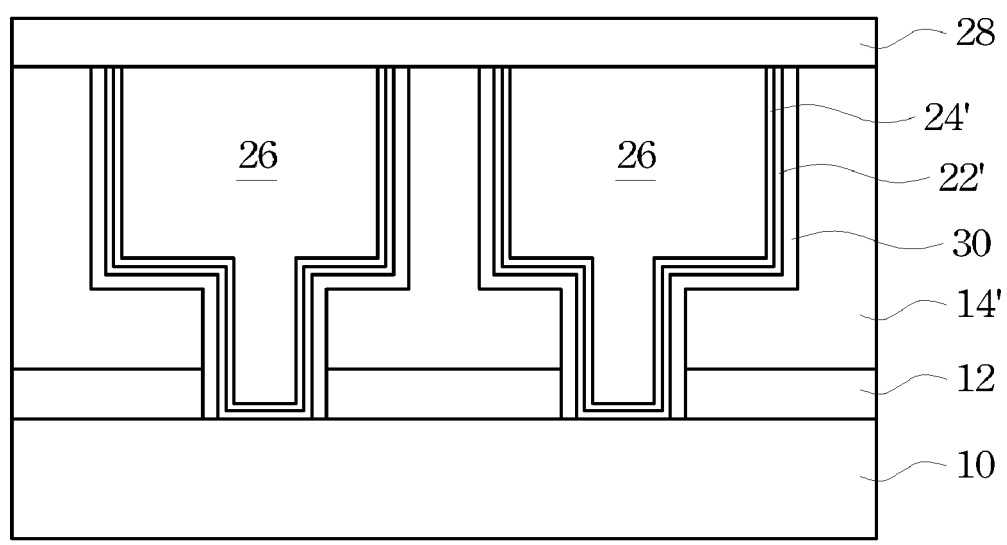

Referring to FIG. 2G, a second etch stop layer 28 is formed on the above-described planarized surface. A thermal process may be performed on the substrate 10. During and/or after the thermal process, the first additive metal element of the conductive seed layer 24 may, diffuse through the liner 22, partially or completely, to the interface of the IMD layer 14'. The diffused first additive metal element may react with the liner 22 and the IMD layer 14' to from a barrier layer 30 as shown in FIG. 2H.

The barrier layer 30 is formed in a self-aligned manner at the boundary between the IMD layer 14' and the liner 22. The barrier layer 30 may have a thickness in the range of between about 5 angstrom and about 30 angstroms, and preferably in the range of between about 10 angstroms and about 20 angstroms. In one embodiment, the barrier layer 30 is a carbon-containing layer and/or a nitrogen-containing layer because of the carbon and/or the nitrogen existed in the liner 22. In another embodiment, the barrier layer 30 is MnOx and/or MnSiyOz with carbon and/or nitrogen. In other embodiments, the barrier layer 30 has a ratio by weight of carbon to silicon about equal or greater than 0.5 and nitrogen to silicon about equal or greater than 0.3. After the annealing process, the liner 22 is transformed to be a post liner 22' or may be completely transformed into the barrier 30 and not present in the final structure.

Figure 3A:
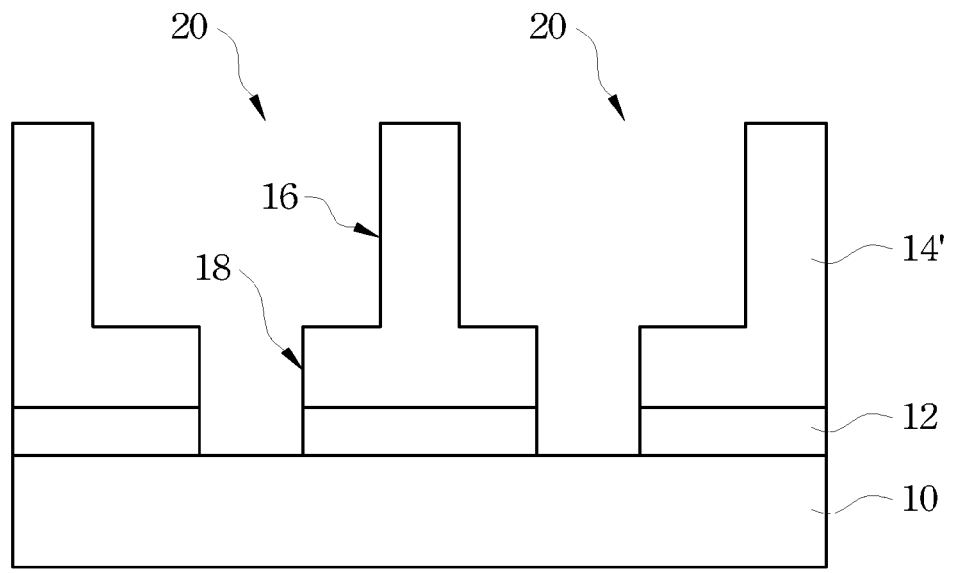
FIG. 3A-3G are cross-sectional diagrams illustrating various process steps of forming a copper interconnect in accordance with another embodiment of the present disclosure.

FIGS. 3A-3G illustrate a third method of forming a copper interconnect in accordance with an embodiment of the present disclosure. With reference now to FIG. 3A, a semiconductor substrate 10 is provided with a stacked dielectric structure including a first etch stop layer 12 and an inter-metal dielectric (IMD) layer 14' formed thereon, and openings 20 formed in the stacked dielectric structure. The IMD layer 14' may be formed of $SiO_2$, carbon-doped $SiO_2$, a comparatively low dielectric constant (k value) dielectric material with a k value less than about 4.0, or combinations thereof. The IMD layer 14' may be formed of a low-k dielectric material, an extreme low-k dielectric material, a porous low-k dielectric layer, and combinations thereof.

Figure 3B:
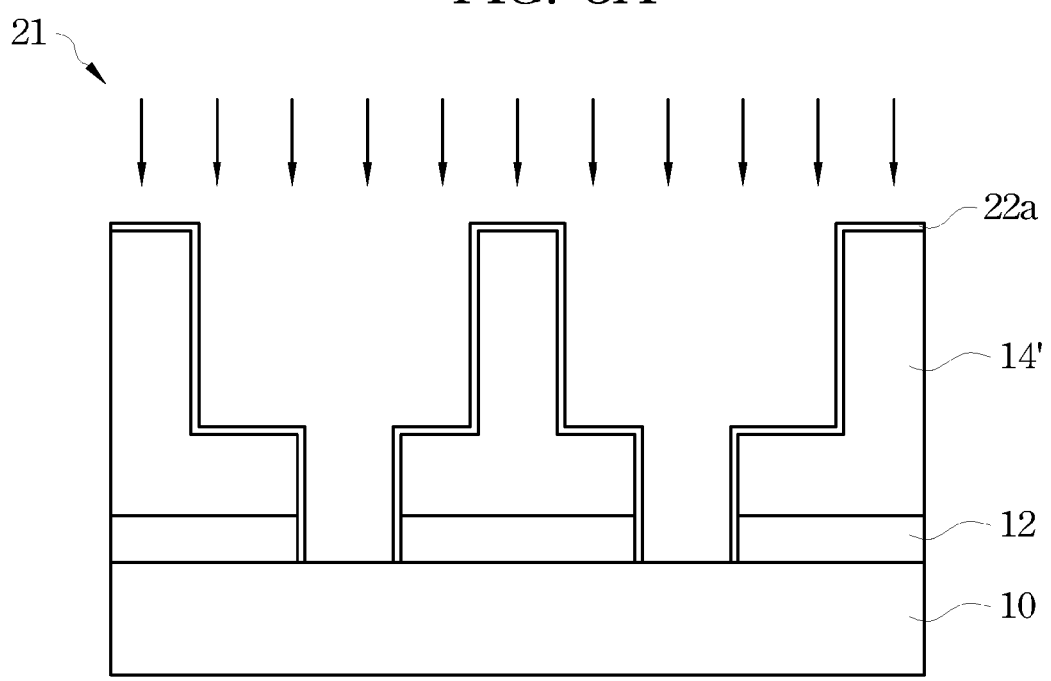

Referring now to FIG. 3B, a treatment 21 is provided on the above-described structure. The treatment 21 includes thermal process, plasma process, implantation process, or other suitable process, to incorporate carbon and/or nitrogen in the surface of the IMD layer 14' to form a liner 22a on the sidewalls of the dual damascene openings 20. In one embodiment, the plasma process is performed by using $CO_2$, $NH_3$, $N_2$, CN, CxHy, or the combinations thereof. In another embodiment, the thermal process is performed under a carbon-containing and/or a nitrogen-containing ambient by using hexamethyl disilazane (HMDS) or the like in a temperature in the range of between about 100° C. and about 400° C. The liner 22a has a thickness of about 10 angstroms to about 300 angstroms, and preferably in the range of between about 5 angstroms and about 30 angstroms. The liner 22a has a ratio by weight of carbon to silicon about equal or greater than 0.5 and nitrogen to silicon about equal or greater than 0.3.

Figure 3C:
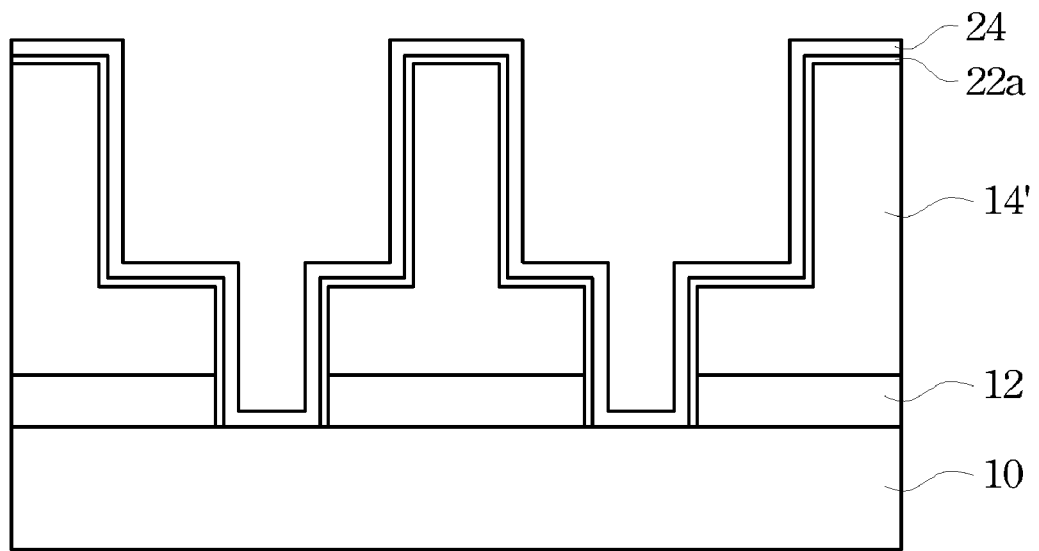
Figure 3D:
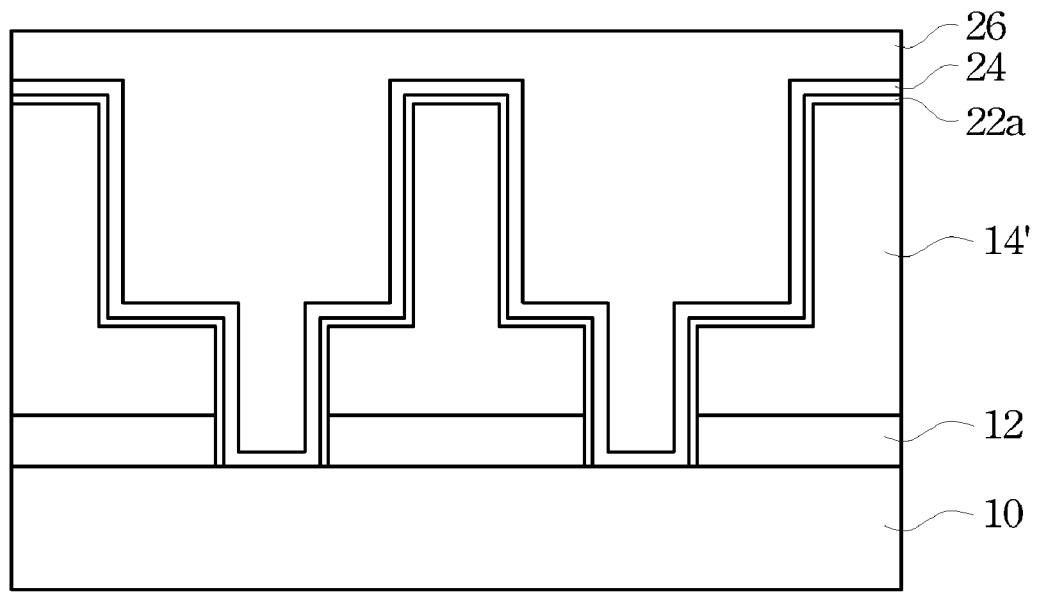
Figure 3E:
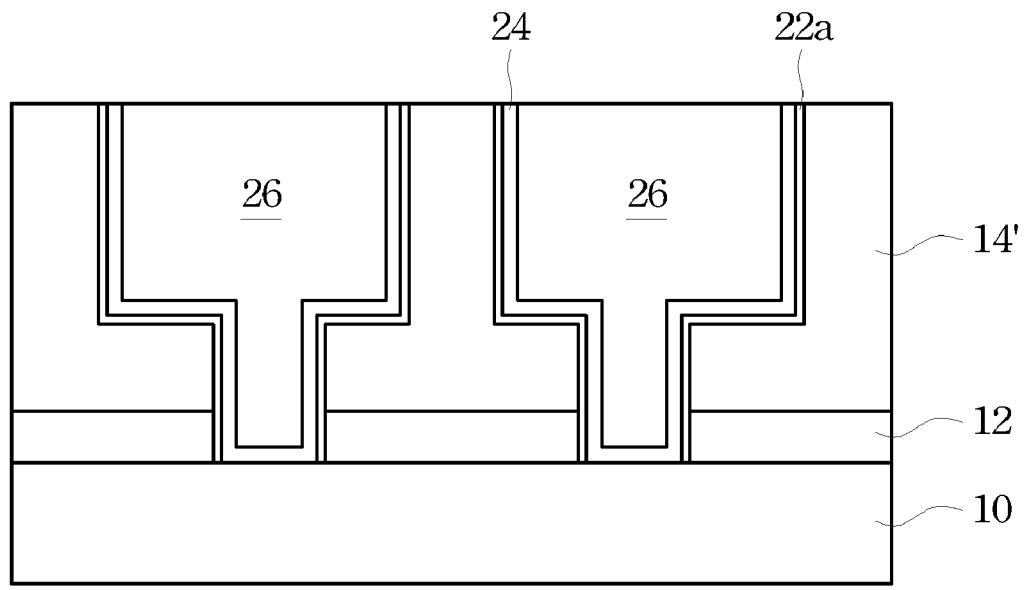

Referring to FIG. 3C, a conductive seed layer 24 is formed on the sidewalls of the liner 22a and bottom of the dual damascene openings 20. Next, in FIG. 3D, a conductive layer 26 is filled in the dual damascene openings 20. Referring to FIG. 3E, a CMP process is performed to remove the excess portions of the conductive layer 26, and the conductive seed layer 24 and the liner 22a outside the dual damascene openings 20, thus exposing the top surface of the IMD layer 14' and achieving a planarized surface.

Figure 3F:
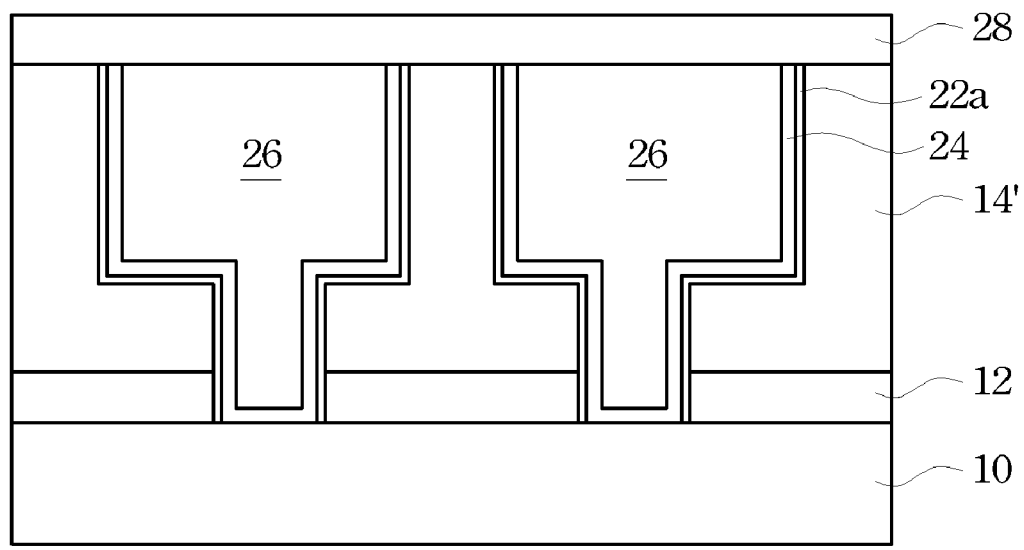
Figure 3G:
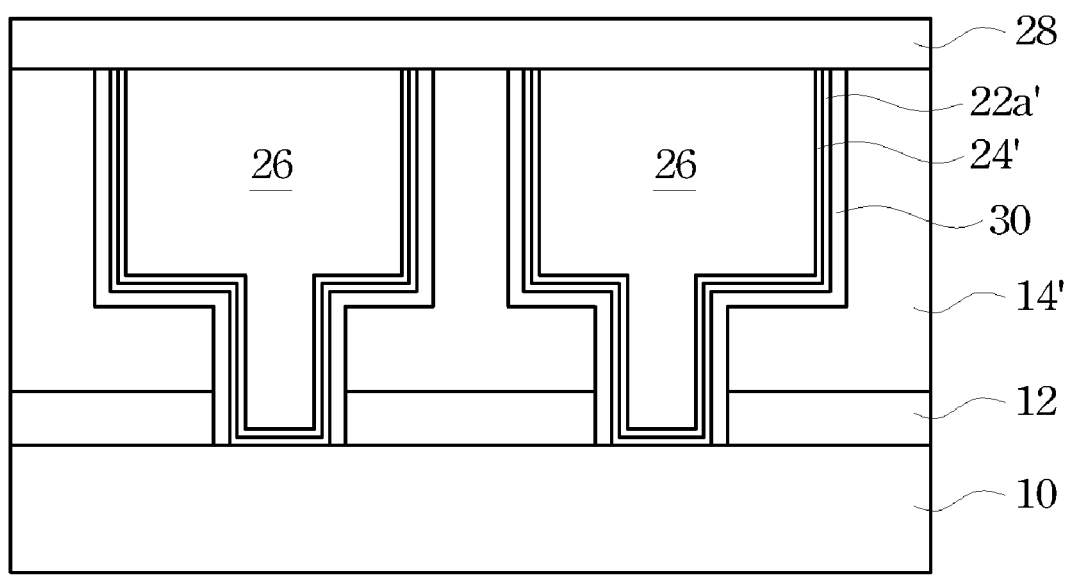

Referring to FIG. 3F, a second etch stop layer 28 is formed on the above-described planarized surface. A thermal treatment may be performed on the substrate 10. During and/or after the thermal treatment, the first additive metal element of the conductive seed layer 24 may, diffuse through the liner 22a, partially or completely, to the interface of the IMD layer 14'. The diffused first additive metal element may react with the liner 22a and the IMD layer 14' to from a barrier layer as shown in FIG. 3F. The barrier layer 30 is formed in a self-aligned manner at the boundary between the IMD layer 14' and the liner 22a. The barrier layer 30 may have a thickness in the range of between about 5 angstrom and about 30 angstroms, and preferably in the range of between about 10 angstroms and about 20 angstroms. In embodiments, the barrier layer 30 is a carbon-containing layer and/or a nitrogen-containing layer because the carbon and/or the nitrogen existed in the liner 22a. In another embodiment, the barrier layer 30 is MnOx and/or MnSiyOz with carbon and/or nitrogen. In other embodiments, the barrier layer 30 has a ratio by weight of carbon to silicon about equal or greater than 0.5 and nitrogen to silicon about equal or greater than 0.3. After the annealing process, the liner 22a is transformed to be a post liner 22a' and may be completely transformed into the barrier 30 and not present in the final structure. After the annealing process, the conductive seed layer 24 is transformed to be a post conductive seed layer 24' with the first additive metal element less than the first additive metal element in the conductive seed layer 24. In another embodiment, the post conductive seed layer 24' contains the main metal element but without the first additive metal element because the first additive metal element has been consumed entirely after the annealing process.

In various embodiments, the conductive layer 26 is formed as an interconnect structure in the dual damascene openings 20 patterned in the IMD layer 14. The barrier layer 30 with carbon and/or nitrogen is formed between the conductive layer 26 and the IMD layer 14 (or 14'). The second etch stop layer 28 is formed over the conductive layer 26 and the IMD layer 14 (or 14'). The post conductive seed layer 24' may be present between the conductive layer 26 and the barrier layer 30. The barrier layer 30 formed in a self-aligned manner can solve the contact issue to improve package capabilities. Further, the barrier layer 30 containing carbon and/or nitrogen can increase corrosion resistance during the subsequent chemical mechanical polishing (CMP) process and/or increase electromigration resistance. These can improve device performance.

Although the present disclosure has been described in its preferred embodiments, it is not intended to limit the disclosure to the precise embodiments disclosed herein. Those skilled in this technology can still make various alterations and modifications without departing from the scope and spirit of this invention.

What is claimed is:

1. A method, comprising:
   forming a dielectric layer overlying a substrate;
   forming an opening in the dielectric layer;
   forming a seed layer overlying the opening;
   filling a conductive layer in the opening; and
   performing a thermal process to cause a metal in the seed layer to diffuse to the dielectric layer and react with carbon or nitrogen in the dielectric layer to form a metal oxide barrier layer underlying the conductive layer, wherein the metal oxide barrier layer contains carbon or nitrogen.

2. The method of claim 1, wherein the metal oxide barrier layer is formed between the seed layer and the dielectric layer.

3. The method of claim 1, wherein:
   the substrate is a semiconductor substrate; and
   the seed layer is a copper alloy seed layer.

4. The method of claim 3, wherein the metal oxide barrier layer has a ratio by weight of carbon to silicon about equal to or greater than 0.5 or a ratio by weight of nitrogen to silicon about equal to or greater than 0.3.

5. The method of claim 1, wherein the dielectric layer is a carbon-containing and nitrogen-containing dielectric layer.

6. The method of claim 5, wherein the dielectric layer has a ratio by weight of carbon to silicon about equal to or greater than 0.5 and a ratio by weight of nitrogen to silicon about equal to or greater than 0.3.

7. The method of claim 1, further comprising:
   forming a liner overlying sidewalls of the opening, wherein the liner contains at least one of carbon, nitrogen or a combination thereof.

8. The method of claim 7, wherein the liner has a thickness ranging between about 5 angstroms and about 50 angstroms.

9. The method of claim 1, further comprising:
   performing a treatment to the substrate to incorporate carbon, nitrogen or a combination thereof in sidewalls of the opening.

10. The method of claim 9, wherein the treatment comprises at least one of a thermal process, a plasma process or an implantation process.

11. The method of claim 10, wherein the thermal process is performed under carbon-containing and/or nitrogen-containing ambient at a temperature ranging between about 100° C. and about 400° C.

12. The method of claim 10, wherein the plasma process is performed by using at least one of $CO_2$, $NH_3$, $N_2$, CN, $C_xH_y$, or a combination thereof.

13. The method of claim 1, wherein the seed layer is a copper metal alloy layer comprising at least one of manganese (Mn), Aluminum (Al), or a combination thereof.

14. The method of claim 1, wherein the metal oxide barrier layer comprises at least one of a $Mn_xO_y$ layer, a $MnSi_aO_b$ layer, or a combination thereof.

15. A method, comprising:
    forming a dielectric layer overlying a semiconductor substrate;
    forming an opening in the dielectric layer;
    forming a liner overlying the opening in the dielectric layer;
    forming a seed layer overlying the liner;
    filling a conductive layer in the opening; and
    performing a thermal process to cause a metal in the seed layer to diffuse, through the liner, to the dielectric layer and react with carbon or nitrogen in the dielectric layer to form a metal oxide barrier layer underlying the conductive layer, wherein the metal oxide barrier layer contains carbon or nitrogen.

16. The method of claim 15, wherein the liner is formed by performing a treatment to the substrate.

17. The method of claim 15, wherein the liner is formed by performing a thermal treatment to the substrate under at least one of a carbon-containing ambient or a nitrogen-containing ambient.

18. The method of claim 15, wherein the liner is formed by performing a plasma treatment on the substrate by using at least one of $CO_2$, $NH_3$, $N_2$, CN, $C_xH_y$ or combinations thereof.

19. The method of claim 15, wherein the liner has a ratio by weight of carbon to silicon about equal to or greater than 0.5 or a ratio by weight of nitrogen to silicon about equal to or greater than 0.3.

20. The method of claim 15, wherein the liner is at least one of silicon carbide (SiC), silicon carbon nitride (SiCN), silicon oxycarbide (SiCO), silicon nitride (SiN), silicon oxycarbide nitride (SiCON) or a combination thereof.

21. The method of claim 15, wherein the liner is deposited by at least one of chemical vapor deposition (CVD), physical vapor deposition (PVD), atomic layer deposition (ALD) or plasma enhanced CVD (PECVD).

22. The method of claim 21, further comprising performing a plasma etching to the substrate to remove overhangs of the liner and portions of the liner formed on a bottom of the opening.

23. The method of claim 15, wherein the metal oxide barrier layer is formed between the seed layer and the dielectric layer.

* * * * *